United States Patent
Morero et al.

(10) Patent No.: US 12,081,274 B1
(45) Date of Patent: *Sep. 3, 2024

(54) PROBABILISTIC SHAPING TECHNIQUES FOR HIGH PERFORMANCE COHERENT OPTICAL TRANSCEIVERS

(71) Applicant: Marvell Asia Pte Ltd, Singapore (SG)

(72) Inventors: Damian Alfonso Morero, Córdoba (AR); Mario A. Castrillion, Santa Clara, CA (US); Ramiro Rogelio Lopez, San Jose, CA (US); Cristian Cavenio, Córdoba (AR); Gabriel Infante, San Jose, CA (US); Mario Rafael Hueda, Córdoba (AR)

(73) Assignee: Marvell Asia Pte Ltd, Singapore (SG)

( * ) Notice: Subject to any disclaimer, the term of this patent is extended or adjusted under 35 U.S.C. 154(b) by 0 days.

This patent is subject to a terminal disclaimer.

(21) Appl. No.: 18/211,094

(22) Filed: Jun. 16, 2023

Related U.S. Application Data (63) Continuation of application No. 17/534,766, filed on Nov. 24, 2021, now Pat. No. 11,683,101, which is a
(Continued)

(51) Int. Cl.
*H04B 10/00* (2013.01)
*H04B 10/40* (2013.01)
(Continued)

(52) U.S. Cl.
CPC ........... *H04B 10/616* (2013.01); *H04B 10/40* (2013.01); *H04B 10/6161* (2013.01);
(Continued)

(58) Field of Classification Search
CPC .. H04B 10/616; H04B 10/40; H04B 10/6161; H04B 10/6162; H04B 10/61;
(Continued)

(56) References Cited

U.S. PATENT DOCUMENTS 8,761,609 B1   6/2014   Agazzi et al.
9,112,614 B2   8/2015   Randel et al.
(Continued)

OTHER PUBLICATIONS

Sakamoto, Takahide, Coherent Matched Detection with Multi-Input-Multi-Output Equalization for Demultiplexing/Demodulation of Orthogonally Time/Frequency Domain Multiplexed Signal, 2012, Optical Society of America (Year: 2012).
(Continued)

*Primary Examiner* — Hanh Phan (57) ABSTRACT

A method and structure for probabilistic shaping and compensation techniques in coherent optical receivers. According to an example, the present invention provides a method and structure for an implementation of distribution matcher encoders and decoders for probabilistic shaping applications. The techniques involved avoid the traditional implementations based on arithmetic coding, which requires intensive multiplication functions. Furthermore, these probabilistic shaping techniques can be used in combination with LDPC codes through reverse concatenation techniques.

26 Claims, 5 Drawing Sheets

Related U.S. Application Data continuation of application No. 17/077,755, filed on Oct. 22, 2020, now Pat. No. 11,190,276, which is a continuation of application No. 16/797,704, filed on Feb. 21, 2020, now Pat. No. 10,848,249, which is a continuation of application No. 16/256,971, filed on Jan. 24, 2019, now Pat. No. 10,608,749.

(60) Provisional application No. 62/621,521, filed on Jan. 24, 2018.

(51) Int. Cl.
  *H04B 10/61*  (2013.01)
  *H04L 27/227* (2006.01)
  *H04L 27/38*  (2006.01)
  *H04J 14/02*  (2006.01)

(52) U.S. Cl.
  CPC ..... *H04B 10/6162* (2013.01); *H04L 27/2275* (2013.01); *H04L 27/3836* (2013.01); *H04J 14/0298* (2013.01)

(58) Field of Classification Search
  CPC .............. H04B 10/516; H04B 10/5161; H04B 10/548; H04L 27/2275; H04L 27/3836; H04L 27/2634; H04L 27/2628; H04L 27/2697
  USPC ....... 398/135, 136, 137, 138, 139, 140, 158, 398/159, 202, 204, 205, 207, 208, 209, 398/183, 188, 192, 193, 194; 375/340, 375/265, 260, 316, 295
  See application file for complete search history.

(56) References Cited

U.S. PATENT DOCUMENTS

| | | | |
|---|---|---|---|
| 9,319,058 B1 | 4/2016 | Yu et al. | |
| 9,369,213 B1 | 6/2016 | Kakande et al. | |
| 10,305,603 B2 | 5/2019 | Dar | |
| 10,608,749 B1* | 3/2020 | Morero | H04B 10/616 |
| 10,715,259 B1 | 7/2020 | Hueda et al. | |
| 10,742,328 B2 | 8/2020 | Wu et al. | |
| 10,848,249 B2* | 11/2020 | Morero | H04B 10/516 |
| 11,190,276 B2 | 11/2021 | Morero et al. | |
| 11,683,101 B1* | 6/2023 | Morero | H04B 10/6161 |
| | | | 398/208 |
| 2002/0044322 A1 | 4/2002 | Blumenthal et al. | |
| 2005/0271387 A1 | 12/2005 | Kee et al. | |
| 2008/0240325 A1 | 10/2008 | Agazzi et al. | |
| 2009/0304103 A1 | 12/2009 | Vaidyanathan et al. | |
| 2010/0021163 A1 | 1/2010 | Shieh | |
| 2010/0138722 A1 | 6/2010 | Harley et al. | |
| 2011/0176815 A1 | 7/2011 | Frankel et al. | |
| 2011/0310951 A1 | 12/2011 | Cvijetic et al. | |
| 2013/0195455 A1 | 8/2013 | Jansen et al. | |
| 2013/0272704 A1 | 10/2013 | Zamani et al. | |
| 2014/0072307 A1 | 3/2014 | Zamani et al. | |
| 2014/0099116 A1 | 4/2014 | Bai et al. | |
| 2014/0169501 A1 | 6/2014 | Nazarathy et al. | |
| 2014/0186024 A1 | 7/2014 | Randel et al. | |
| 2015/0043917 A1 | 2/2015 | Simonneau et al. | |
| 2015/0093119 A1 | 4/2015 | Gorshtein et al. | |
| 2015/0256267 A1 | 9/2015 | Randel | |
| 2016/0112143 A1 | 4/2016 | Yu et al. | |
| 2016/0204871 A1 | 7/2016 | Li et al. | |
| 2017/0141844 A1 | 5/2017 | Sakamoto | |
| 2017/0250776 A1 | 8/2017 | Morsy-Osman et al. | |
| 2019/0081726 A1 | 3/2019 | Rafique et al. | |
| 2019/0149239 A1* | 5/2019 | Tehrani | G06F 17/18 |
| | | | 398/183 |
| 2019/0149242 A1* | 5/2019 | Torbatian | H04L 1/005 |
| | | | 398/185 |
| 2019/0268076 A1 | 8/2019 | Awadalla | |

OTHER PUBLICATIONS

Sakamoto et al., Loop-Assisted Coherent Matched Detector for Parallel Time-Frequency Sampling, 2017, IEEE, pp. 807-814 (Year: 2017).

Randel et al., 6×56-GB/s mode-division multiplexed transmission over 33-km few-mode fiber enabled by 6×6 MIMO equalization, 2011, Optical Society of America (Year: 2011).

Junita et al., Hybrid Subcarrier Multiplexing Wavelength Division Multiplexing Using Laser and LED Spectral Slicing Architecture, 2012, IEEE (Year: 2012).

* cited by examiner

PROBABILISTIC SHAPING TECHNIQUES FOR HIGH PERFORMANCE COHERENT OPTICAL TRANSCEIVERS

CROSS-REFERENCES TO RELATED APPLICATIONS

The present application claims priority to and is a continuation of U.S. application Ser. No. 17/534,766 filed on Nov. 24, 2021, which claims priority to and is a continuation of U.S. application Ser. No. 17/077,755 filed on Oct. 22, 2020, which claims priority to and is a continuation of U.S. application Ser. No. 16/797,704 filed on Feb. 21, 2020, which is a continuation of U.S. application Ser. No. 16/256,971 filed on Jan. 24, 2019, now U.S. Pat. No. 10,608,749, which claims priority to U.S. Provisional App. No. 62/621,521, filed on Jan. 24, 2018, all of which are incorporated by reference for all purposes.

BACKGROUND OF THE INVENTION

The present invention relates to communication systems and integrated circuit (IC) devices. More particularly, the present invention provides for improved methods and devices for optical communication.

Over the last few decades, the use of communication networks exploded. In the early days Internet, popular applications were limited to emails, bulletin board, and mostly informational and text-based web page surfing, and the amount of data transferred was usually relatively small. Today, Internet and mobile applications demand a huge amount of bandwidth for transferring photo, video, music, and other multimedia files. For example, a social network like Facebook processes more than 500 TB of data daily. With such high demands on data and data transfer, existing data communication systems need to be improved to address these needs.

Optical communication is one major technological area that is growing to address these high demands on data. Optical communication systems typically communicate data over a plurality of channels corresponding to different phases and/or polarizations of the optical signal. While the data communicated over the different channels is typically aligned relative to a common clock when transmitted by the transmitter, delay (or skew) may be introduced into one or more of the channels based on characteristics of the transmitter, receiver, and/or the optical fiber. As a result, the relative timing of the data in the various channels may be misaligned at the receiver, causing degradation of the recovered data.

Although there are several types of devices and methods related to optical communication systems, they have been inadequate for the advancement of various applications. Conventional embodiments consume large areas or large amounts of power and suffer from performance limitations. Therefore, improved devices and methods for optical communication systems and related electronics are highly desired.

BRIEF SUMMARY OF THE INVENTION

The present invention relates to communication systems and integrated circuit (IC) devices. More particularly, the present invention provides for improved methods and devices for optical communication.

According to an example, the present invention provides a method and structure for an implementation of distribution matcher encoders and decoders for probabilistic shaping applications. The device can include a distribution matcher encoder module configured with the means to convert data from a first form to a second form according to an encoder method using probabilistic shaping. These methods can be implemented in hardware or in software. The device can also include a distribution matcher decoder module configured with the means to convert data from the second form to the first form according to a decoder method using probabilistic shaping. Similar to the encoder module, the decoder module can be implemented in hardware or in software. Further, a channel module electrically coupled between the distribution matcher encoder module and the distribution matcher decoder module. The distribution matcher encoder module can be provided on an egress path coupled to the channel module, while the distribution matcher decoder module is provided on an ingress path coupled to the channel module.

In a specific example, the egress path can include a splitter module electrically coupled to the distribution matcher encoder module and configured to receive data. The egress path can also include a forward error correction (FEC) encoder module electrically coupled to the splitter module and the distribution matcher encoder module. And, a mapper module can be electrically coupled to the FEC encoder module and the channel module. The ingress path can have a similar configuration with a demapper module electrically coupled to the channel module, a forward error correction (FEC) decoder module electrically coupled to the demapper module and the distribution matcher decoder module, and a merger module electrically coupled to the distribution matcher decoder module and the FEC decoder module, and configured to output data.

The methods and structures of the present invention provide many benefits for optical communication. Specifically, the techniques involved avoid the traditional implementations based on arithmetic coding, which requires intensive multiplication functions. Furthermore, these probabilistic shaping techniques can be used in combination with LDPC codes or any other Error Correction Code (such as Turbo Codes, Polar Codes, BCH/RS Codes, Braided Codes) through reverse concatenation techniques.

A further understanding of the nature and advantages of the invention may be realized by reference to the latter portions of the specification and attached drawings.

BRIEF DESCRIPTION OF THE DRAWINGS

In order to more fully understand the present invention, reference is made to the accompanying drawings. Understanding that these drawings are not to be considered limitations in the scope of the invention the presently described embodiments and the presently understood best mode of the invention are described with additional detail through the use of the accompanying drawings in which.

DETAILED DESCRIPTION OF THE INVENTION

The present invention relates to communication systems and integrated circuit (IC) devices. More particularly, the present invention provides for improved methods and devices for optical communication.

The following description is presented to enable one of ordinary skill in the art to make and use the invention and to incorporate it in the context of particular applications. Various modifications, as well as a variety of uses in different applications will be readily apparent to those skilled in the art, and the general principles defined herein may be applied to a wide range of embodiments. Thus, the present invention is not intended to be limited to the embodiments presented, but is to be accorded the widest scope consistent with the principles and novel features disclosed herein.

In the following detailed description, numerous specific details are set forth in order to provide a more thorough understanding of the present invention. However, it will be apparent to one skilled in the art that the present invention may be practiced without necessarily being limited to these specific details. In other instances, well-known structures and devices are shown in block diagram form, rather than in detail, in order to avoid obscuring the present invention.

The reader's attention is directed to all papers and documents which are filed concurrently with this specification and which are open to public inspection with this specification, and the contents of all such papers and documents are incorporated herein by reference. All the features disclosed in this specification, (including any accompanying claims, abstract, and drawings) may be replaced by alternative features serving the same, equivalent or similar purpose, unless expressly stated otherwise. Thus, unless expressly stated otherwise, each feature disclosed is one example only of a generic series of equivalent or similar features.

Furthermore, any element in a claim that does not explicitly state "means for" performing a specified function, or "step for" performing a specific function, is not to be interpreted as a "means" or "step" clause as specified in 35 U.S.C. Section 112, Paragraph 6. In particular, the use of "step of" or "act of" in the Claims herein is not intended to invoke the provisions of 35 U.S.C. 112, Paragraph 6.

Please note, if used, the labels left, right, front, back, top, bottom, forward, reverse, clockwise and counter clockwise have been used for convenience purposes only and are not intended to imply any particular fixed direction. Instead, they are used to reflect relative locations and/or directions between various portions of an object.

I. Overview

According to an example, the present invention provides a method and structure for an implementation of distribution matcher encoders and decoders for probabilistic shaping applications. The techniques involved avoid the traditional implementations based on arithmetic coding, which requires intensive multiplication functions. Furthermore, these probabilistic shaping techniques can be used in combination with LDPC codes or any other Error Correction Code (such as Turbo Codes, Polar Codes, BCH/RS Codes, Braided Codes) through reverse concatenation techniques.

In order to achieve Shannon capacity, constellation shaping must be applied. This can be achieved by using geometric shaping and/or probabilistic shaping. Here, we focus on probabilistic shaping because it can provide better flexibility than geometric shaping. However, conventional techniques for probabilistic shaping are based on the use of complex arithmetic coding technics, which require multipliers and high resolution arithmetic. According to an example, the present invention implements a novel technique based on LUTs and adders in order to achieve a high parallelism and high throughput architecture suitable for optical communications. The complexity of this architecture is moderate and easily implementable with the current technology. Furthermore, the proposed Distribution Matcher is optimal is the sense that it achieves the highest possible rate for a fixed block size.

In order to provide a practical implementation of this technique we combine probabilistic shaping with high coding gain LDPC code, which constitutes the state of the art in error correcting codes for optical communications. The combination is based on a well-known technique call reverse concatenation. Here, we describe an apparatus which is capable of producing numbers with the desired distribution either for cases of constant word weight, i.e., the desired probability is obtained in all codewords. On the other hand, another version is proposed in which the desired probability is obtained in the average of all the codewords. The latter scheme allows a higher coding efficiency.

Simulation results of a multi-level QAM modulation with probabilistic shaping are also provided. Also, an analysis of the pipelining of the forward and backward recursions present in the algorithm is carried out in order to provide some intuition about feasibility and obstacles in the practical implementation.

II. Probabilistic Shaping

A. Distribution Matching (DM)

DMs transform a sequence of uniformly distributed input bits into an output sequence of symbols from an alphabet A with a desired distribution. A fixed-to-fixed length DM maps an input vector of k bits denoted d to an output vector of n symbols s=DM(d). The mapping DM is invertible, i.e., d can be recovered from a s by applying the inverse mapping $DM^{-1}$. The rate of the DM is as follows:

$$R_{DM} = \frac{k}{n} \quad (1)$$

Let $n_a$ (s) be the number of symbols $a \in A$ present in the output vector s. If for each $a \in A$, the $n_a(s)$ has the same value for all valid output vectors s, the DM is called Constant Composition Distribution Matcher (CCDM) and $n_a(s)$ is denoted by $n_a$. In this case, the input dimension k can be computed based on the multinomial distribution as follows:

$$k = \lfloor \log_2(n_{a_0}, n_{a_1}, \ldots n_{a_{q-1}}) \rfloor. \quad (2)$$

where q=|A|; and $a_i \in A$ for i=0, 1, ..., q−1; and the output distribution is as follows:

$$P_A(a) = \frac{n_a}{n} \quad (3)$$

An important metric of any particular implementation of the DM is its rate loss Ross. The rate loss is the difference between the entropy rate H(A) of a discrete memory-less source (DMS) with probability PA and the DM rate k/n, and is represented as follows:

$$R_{loss} = \mathbb{H}(A) - \frac{k}{n} \quad (4)$$

The rate loss of CCDM vanishes for large output lengths n. In an example of the present invention, we are interested in DMs with relatively short output lengths and we therefore need to account for the rate loss in our system design.

In an example, the constraint imposed on $n_a$ (s) by the CCDM must be avoided to reduce the rate loss. An example of an optimal DM algorithm without this constraint is also introduced in section III.

B. Modulation

We consider a constellation based on pulse amplitude modulation (PAM) with $q=2^m$ points in each dimension. The set of these points is denoted by X, and is represented as follows:

$$X = \{\pm 1, \pm 3, \ldots, \pm(2^m - 1)\} \quad (5)$$

Let A denote the set of amplitudes of X, represented as follows:

$$A = \{1, 3, \ldots, (2^m - 1)\} = \{|x| : x = x \in X\} \quad (6)$$

In an example, the present invention includes a label function B: X→{0, 1}m and corresponding bits mappers x: {0, 1}$_m$→X. Let b=[b$_1$, b$_1$, . . . , b$_m$]∈{0, 1}$^m$. The label function B and the mapper x are divided in two sub-functions with one for the amplitude and one for the sign of point x∈X, shown as follows:

$$x = \begin{cases} -x_{\mathcal{A}}(b_2, \ldots, b_m) & \text{if } b_1 = 1 \\ x_{\mathcal{A}}(b_2, \ldots, b_m) & \text{if } b_1 = 0 \end{cases} \quad (7)$$

where xA: {0, 1}$^m$→A maps bits to amplitudes and similarly its inverse function is denoted $B_A$: A→{0, 1}$^{m-1}$.

The two classical implementations of xA and $B_A$ are based on the binary reflected Gray code (BRGC) and the natural based binary code (NBBC) where the amplitude label is a natural binary code (NBC).

B. Reverse Concatenation

Figure 1:
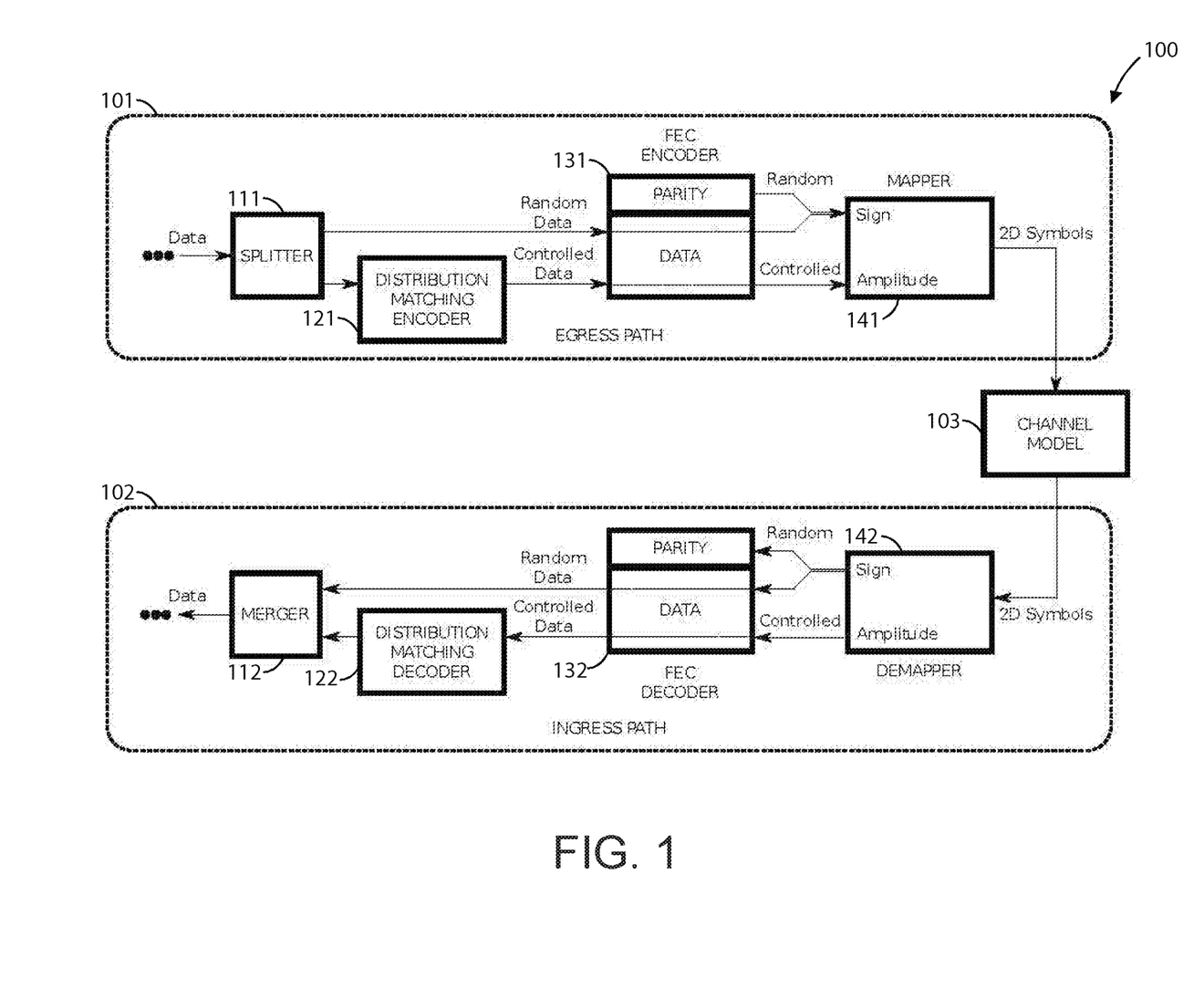
FIG. 1 is a simplified diagram illustrating an implementation architecture of a reverse concatenation scheme according to an example of the present invention.

FIG. 1 is a simplified diagram illustrating an implementation architecture of a reverse concatenation scheme according to an example of the present invention. As shown, device 100 includes an egress path 101 coupled to an ingress path 102 via a channel module 103. The egress path 101 receives data at a splitter module 111, which is electrically coupled to a distribution matching encoder module 121 and a forward error correction (FEC) encoder module 131, which is also electrically coupled to the distribution matching encoder module 121. In a specific example, the input data is split into random data and controlled data; the splitter module 111 sends the controlled data through the distribution matching encoder module 121 to the FEC encoder module 131 while sending the random data directly to the FEC encoder module 131. Also, the FEC encoder module 131 can include a parity module and a data module, and is also electrically coupled to a mapper module 141, which receives the data from the FEC encoder module 131 and outputs 2D symbols to the channel module 103. In a specific example, the FEC encoder module 131 sends the random data along with an output from the parity module to a sign input of the mapper module 141. Further, the FEC encoder module 131 sends the controlled data to an amplitude input of the mapper module 141.

The ingress path 102 reverses the process of the egress path 101. This path receives the 2D symbol data from the channel module 103 at a demapper module 142, which is electrically coupled to an FEC decoder module 132. In a specific example, the demapper module 142 sends the encoded random data and parity data from a sign output, and also sends the encoded controlled data from an amplitude output. Similar to the FEC encoder module 131, the FEC decoder module 132 can include a parity module, which receives the parity data, and a data module, which receives the random and controlled data. The FEC decoder module 132 is electrically coupled to a distribution matching decoder module 122 and a merger module 112. In a specific example, the FEC decoder module 132 sends the random data directly to the merger module 112 while sending the controlled data through the distribution matching decoder 122 to the merger module 112. The merger module 112 then outputs the decoded and merged data.

According to an example, the DM and the FEC code are concatenated in the reverse order as described in FIG. 1 in order to simplify the implementation of the DM decoder and to avoid error propagation. In this example, the DM maps k data bits to n amplitudes, which are represented by a vector of n(m−1) bits. Consider that the FEC code has k dimension and ñ length. Then several blocks of these amplitude bits, referred to as controlled bits in FIG. 1, are grouped in a block of an(m−1) bits. These bits and αγn additional data bits, called random bits, form a block of k=αn(m−1)+αγn, which has to be multiplied with the parity generating part P of a systematic generator matrix [I|P] of the FEC to generate α(1−γ)n redundancy bits. The redundancy bits and the additional data bits are mapped to an signs, which are multiplied symbol-wise with the an amplitudes. The FEC code instantiated by P has a rate determined as follows:

$$c = \frac{\tilde{k}}{\tilde{n}} \quad (8)$$

$$c = \frac{\alpha n(m-1) + \alpha \gamma n}{\alpha m n}$$

$$c = \frac{n(m-1) + \gamma n}{mn} - \frac{m-1+\gamma}{m}$$

The fraction of signs used for data bits is as follows:

$$\gamma = 1 - (1-c)m \quad (9)$$

The reverse concatenation scheme requires 0≤γ≤1. The transmission rate of the reverse scheme is the number of data bits per PAM symbol given by the following:

$$R_t = \frac{k}{n} + \gamma \quad (10)$$

From the point of view of efficiency, CCDM is not the most optimum option since it requires the distribution to be satisfied between all vectors in the codebook for the $R_{loss}$ to be reduced. A minor modification is discussed later in order to address this aspect.

III. Distribution Matcher Algorithm

The majority of distribution matcher implementations are based on arithmetic coding techniques. These techniques are very efficient for data compression where variable length coding is desirable. However, for constant composition distribution matcher (CCDM) where fixed length coding is preferable, arithmetic coding is not straightforward. Furthermore, arithmetic coding requires multiplication operations in each step, which significantly increase its implementation complexity.

In an example, the present invention includes an implementation of a new DM algorithm using a small number of addition and comparison operations and completely avoiding multiplication or division operations. This scheme is also suitable for parallel implementation, as required in high speed signal processing. In addition, the proposed algorithm is also flexible and can easily be configured to provide different target distributions with the same base architecture. In fact, by using either programmable lookup tables (LUTs) or fixed LUTs designed for a desired maximum output weight, the same hardware will work for smaller weights.

The following presents six examples of proposed algorithms for binary output alphabets that can be implemented in various examples of the present invention. The implementations can include both software and hardware types. These algorithms can also be generalized to higher order alphabets in a straightforward manner. Those of ordinary skill in the art will recognize other variations, modifications, and alternatives.

According to an example, the present invention incorporates an encoder algorithm, shown below in Algorithm 1. Here, the input parameters are the code length n, the number of bits per codeword n', and the data input x.

Algorithm 1—Algorithm for Distribution Matcher Encoder I

Input: x, n', n
    Output: b
      1: $a_n = x$
      2: $n'_n = n'$
      3: for i=n−1 to 0 do
      4: if $(a_{i+1} \geq (_{n'_{i+1}-1}{}^i)$ or $n'_{i+1} \leq 0)$ then
      5: $a_i = a_{i+1} - 1 - (_{n'_{i+1}-1}{}^i)$
      6: $b_i = 0$
      7: $n'_i = n'_{i+1}$
      8: else
      9: $a_i = a_{i+1}$
     10: $b_i = 1$
     11: $n'_i = n'_{i+1} - 1$
     12: end if
     13: end for
     14: return b According to an example, the present invention incorporates a decoder algorithm, shown below in Algorithm 2. This decoder algorithm corresponds to the encoder algorithm of Algorithm 1.

Algorithm 2—Algorithm for Distribution Matcher Decoder I

Input: b, n', n
    Output: x
      1: $a_n = 0$
      2: $n'_n = n'$
      3: for i=n−1 to 0 do
      4: if $(b_i = 1$ or $n'_{i+1} = 0)$ then
      5: $a_i = a_{i+1}$
      6: else
      7: $a_i = a_{i+1} + (_{n'_{i+1}-1}{}^i)$
      8: end if
      9: if $(b_i = 1)$ then
     10: $n'_i = n + 1 - 1$
     11: else
     12: $n'_i = n'_{i+1}$
     13: end if
     14: end for
     15: $x = a_0$
     16: return x Algorithms 3 and 4 (below) are different versions of Algorithms 1 and 2, respectively, based on a LUT approach. The implementation architecture of Algorithm 3 is further described in FIGS. 2 and 3, while that of Algorithm 4 is described in FIGS. 4 and 5.

Algorithm 3—Algorithm for Distribution Matcher Encoder I with LUT

Input: x, n', n
    Output: b
      1: $a_n = x$
      2: $n'n = n'$
      3: for i=n−1 to 0 do
      4: if $(a_{i+1} \geq t_i[n'_{i+1}-1]$ or $n'_{i+1} \leq 0)$ then
      5: $a_i = a_{i+1} - t_i[n'_{i+1}-1]$
      6: $b_i = 0$
      7: $n'_i = n'_{i+1}$
      8: else
      9: $a_i = a_{i+1}$
     10: $b_i = 1$
     11: $n'_i = n'_{i+1} - 1$
     12: end if
     13: end for
     14: return b According to an example, the present invention uses carry save adders to implement these algorithms in high-speed optical systems. In these cases, two blocks are required to implement a fully operable system with probabilistic shaping: a distribution matcher encoder, and a distribution matcher decoder.

Figure 2:
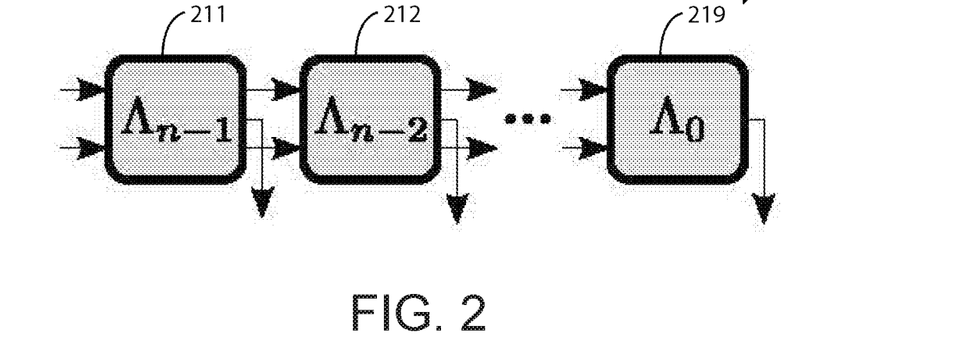
FIG. 2 is a simplified diagram illustrating a distribution matcher encoder architecture according to an example of the present invention.

FIG. 2 is a simplified diagram illustrating a distribution matcher encoder architecture according to an example of the present invention. As shown, device 200 includes a series of n function blocks coupled together in series. Here, a first function block 211 denoted "$\Lambda_{n-1}$," second function block 212 denoted "$\Lambda_{n-2}$," and a final function block 219 denoted "$\Lambda_0$" separated by an ellipsis represent the connection between the n function blocks. Further of the function block are provided in FIG. 3.

Figure 3:
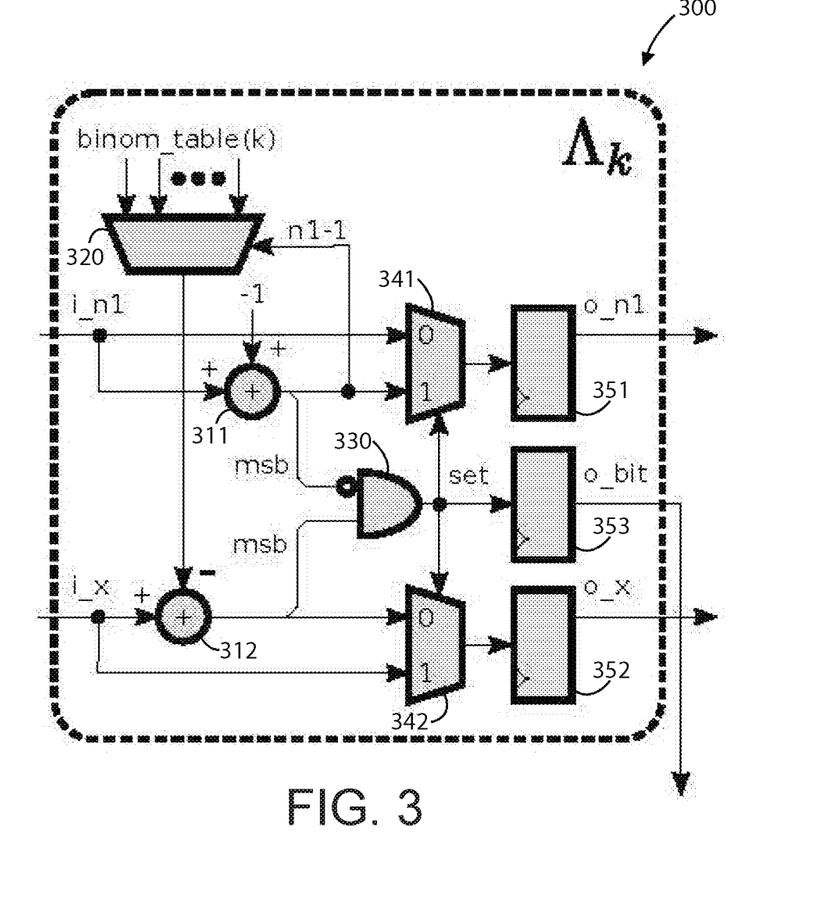
FIG. 3 is a simplified diagram illustrating a distribution matcher encoder function block according to an example of the present invention.

FIG. 3 is a simplified diagram illustrating a distribution matcher encoder function block according to an example of the present invention. More specifically, this device 300 is an example unit architecture configured to perform Algorithm 3 using an LUT approach and addition/subtraction computations. As shown, device 300 receives inputs x (denoted "i_x") and n' (denoted "i_nl") and includes adders 311 and 312; an LUT multiplexer 320; an AND gate (with an inverted input) 330; multiplexers 341 and 342; and storage units 351 (outputting "o_nl"), 352 (outputting "o_x"), and 353 (outputting "o_bit"). Those of ordinary skill in the art will recognize other variations, modifications, and alternatives to implementations of the encoder algorithms discussed herein.

Algorithm 4—Algorithm for Distribution Matcher Decoder I with LUT

Input: b, n', n
Output: x
1: $a_n=0$
2: $n'_n=n'$
3: for i=n−1 to 0 do
4: if ($b_i=1$ or $n'_{i+1}=0$) then
5: $a_i=a_{i+1}$
6: else
7: $a_i=a_{i+1}+t_i[n'_{i+1}-1]$
8: end if
9: if ($b_i=1$) then
10: $n'_i=n'_{i+1}-1$
11: else
12: $n'_i=n'_{i+1}$
13: end if
14: end for
15: $x=a_0$
16: return x From comparing algorithm 1 and algorithm 3, the following relation for the LUT values can be deduced as follows: $t_i[n'_{i+1}-1]=(\binom{n'_{i+1}-1}{i})$. But the LUT values can be smaller than these values and the encoder and decoder algorithms will still work, with the loss of some valid words of the encoder output alphabet. This may not represent a loss of performance in the CCDM due to the flooring operation in equation (2). Modifying the LUT values gives flexibility to the design of the blocks and can be used for several purposes; for instance, to save power.

Figure 4:
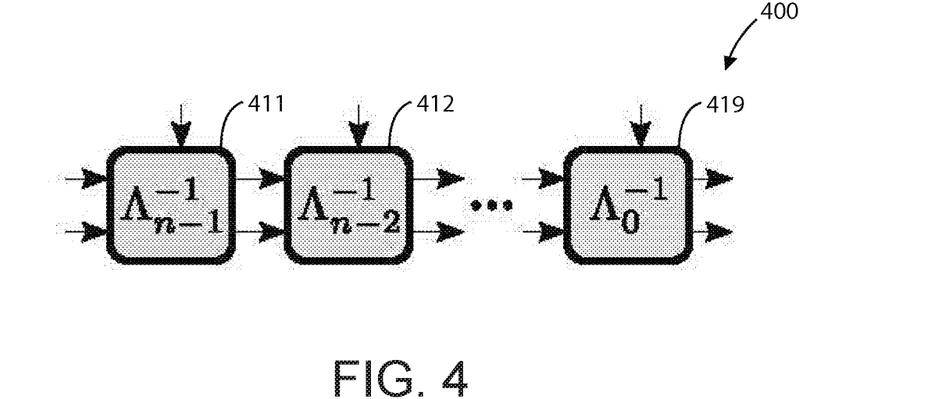
FIG. 4 is a simplified diagram illustrating a distribution matcher decoder architecture according to an example of the present invention.

FIG. 4 is a simplified diagram illustrating a distribution matcher decoder architecture according to an example of the present invention. As shown, device 400 includes a series of n function blocks coupled together in series. Here, a first function block 411 denoted "$\Lambda_{n-1}^{-1}$" a second function block 412 denoted "$\Lambda_{n-2}^{-1}$," and a final function block 419 denoted "$\Lambda_0^{-1}$" separated by an ellipsis represent the connection between the n function blocks. These function blocks correspond to the encoder function blocks shown in FIG. 2. Further of the function block are provided in FIG. 5.

Figure 5:
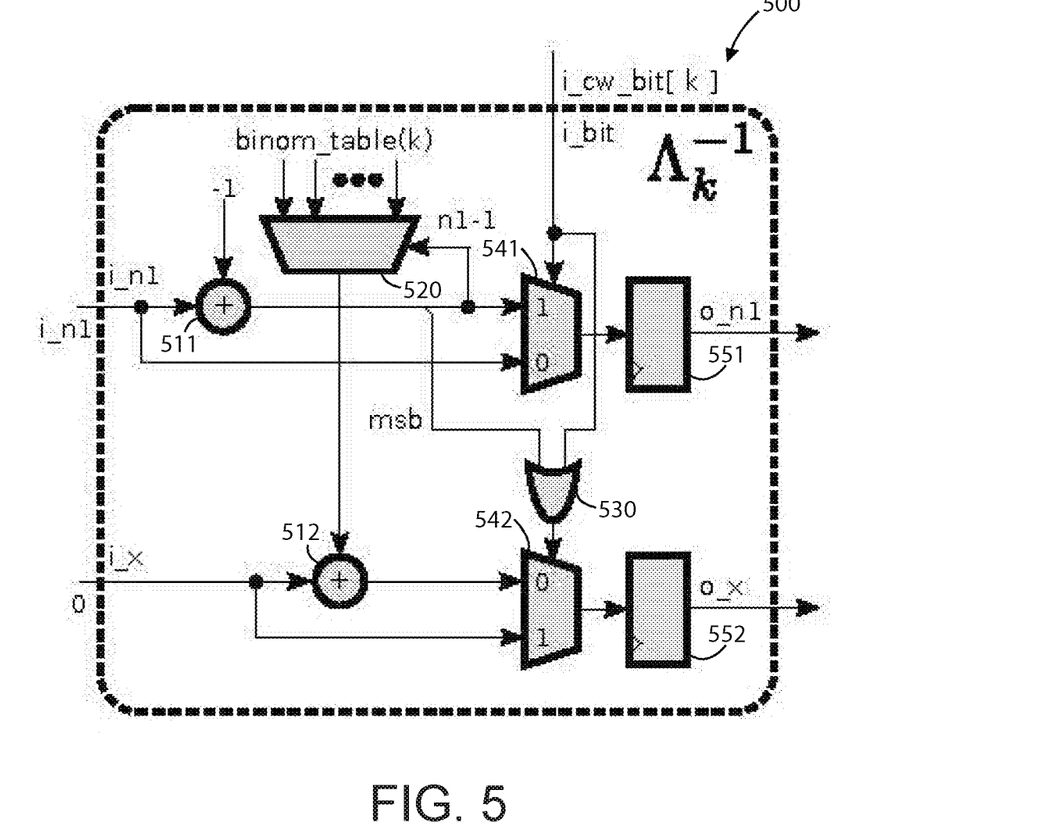
FIG. 5 is a simplified diagram illustrating a distribution matcher decoder function block according to an example of the present invention.

FIG. 5 is a simplified diagram illustrating a distribution matcher decoder function block according to an example of the present invention. More specifically, this device 500 is an example unit architecture configured to perform Algorithm 4 using an LUT approach and addition/subtraction computations. As shown, device 500 receives inputs b (denoted "i_bit"), x (denoted "i_x") and n' (denoted "i_nl") and includes adders 511 and 512; an LUT multiplexer 520; an OR gate 530; multiplexers 541 and 542; and storage units 551 (outputting "o_nl") and 552 (outputting "o_x"). Those of ordinary skill in the art will recognize other variations, modifications, and alternatives to implementations of the decoder algorithms discussed herein.

In order to reduce $R_{loss}$, the present invention can also incorporate modified versions of algorithms 1, 2, 3, and 4, which are shown below in Algorithms 5 and 6. According to a specific example, these modified algorithms avoid the constant compression constraint in $n_a$ (s) and achieves the minimum possible $R_{loss}$ for a given codeword length n.

Algorithm 5—Algorithm for Distribution Matcher Encoder II

Input: x, n
Output: b
1: $n'=0$
2: while ($x \geq \binom{n}{n'}$) do
3: $x=x-\binom{n}{n'}$
4: $n'=n'+1$
5: end while
6: $a_n=x$
7: for i=n−1 to 0 do
8: If ($a_{i+1} \geq t_i[n'-1]$ or $n' \leq 0$) then
9: $a_i=a_{i+1}-t_i[n'-1]$
10: $b_i=0$
11: else
12: $a_1=a_{i+1}$
13: $b_i=1$
14: $n'=n'-1$
15: end if
16: end for
17: return b For the modified encoder, the implementation architecture is equivalent to that described in FIGS. 2 and 3 with the additional sub-algorithm shown in lines 1 to 6 above in Algorithm 5. Those of ordinary skill in the art will recognize other variations, modifications, and alternatives.

Algorithm 6—Algorithm for Distribution Matcher Decoder II

Input: b, n
Output: x
1: $n'_n=\omega_H(b)$
2:

$$a_n = \sum_{k=1}^{\omega_H(b)} \binom{n}{k}$$

3: for i=n−1 to 0 do
4: if ($b_i=1$ or $n'_{i+1}=0$) then
5: $a_i=a_{i+1}$
6: else
7: $a_i=a_{i+1}+t_i[n'_{i+1}-1]$
8: end if
9: if ($b_i=1$) then
10: $n'_i=n'_{i+1}-1$
11: else
12: $n'_i=n'_{i+1}$.
13: end if
14: end for
15: return x For the modified decoder, the implementation architecture is equivalent to the architecture described in FIGS. 4 and 5 with the additional sub-algorithm described in lines 1 to 2 of Algorithm 6. Here, the function $\omega_H(b)$ is the Hamming weight of b (i.e., the number of elements with a value different from zero). The an function is a summation equation of the $\binom{n}{k}$ term from k=1 to k=$\omega_H(b)$. Of course, there can be other variations, modifications, and alternatives.

In an example the present invention provides for a method and structure of a communication device. The device can include a distribution matcher encoder module configured with the means to convert data from a first form (x) to a second form (b) according to an encoder method, such as Algorithms 1, 3, and 5 discussed previously. These methods can be implemented in hardware, such as the examples shown in FIGS. 2 and 3, or in software, which can involve a code programmed with an encoder method that is stored in a memory unit and performed by a processor.

The device can also include a distribution matcher decoder module configured with the means to convert data from the second form to the first form according to a decoder method, such as Algorithms 2, 4, and 6 discussed previously. Similar to the encoder module, the decoder module can be implemented in hardware, such as the examples shown in FIGS. 4 and 5, or in software, which can involve a code programmed with a decoder method that is stored in a memory unit and performed by a processor.

Further, a channel module electrically coupled between the distribution matcher encoder module and the distribution matcher decoder module. In a specific example, the configuration can be similar to that shown in FIG. 1, having an egress path of modules feeding the input data to be encoded and sent to the channel module, which sends the encoded data through the ingress path to be decoded and outputted. Those of ordinary skill in the art will recognize other variations, modifications, and alternatives.

IV. Distribution Matcher Simulation Results

FIGS. 6 and 7A-7D show simulation results from test implementations of the proposed distribution matcher algorithms in combination with an LDPC code according to an example of the present invention.

Figure 6:
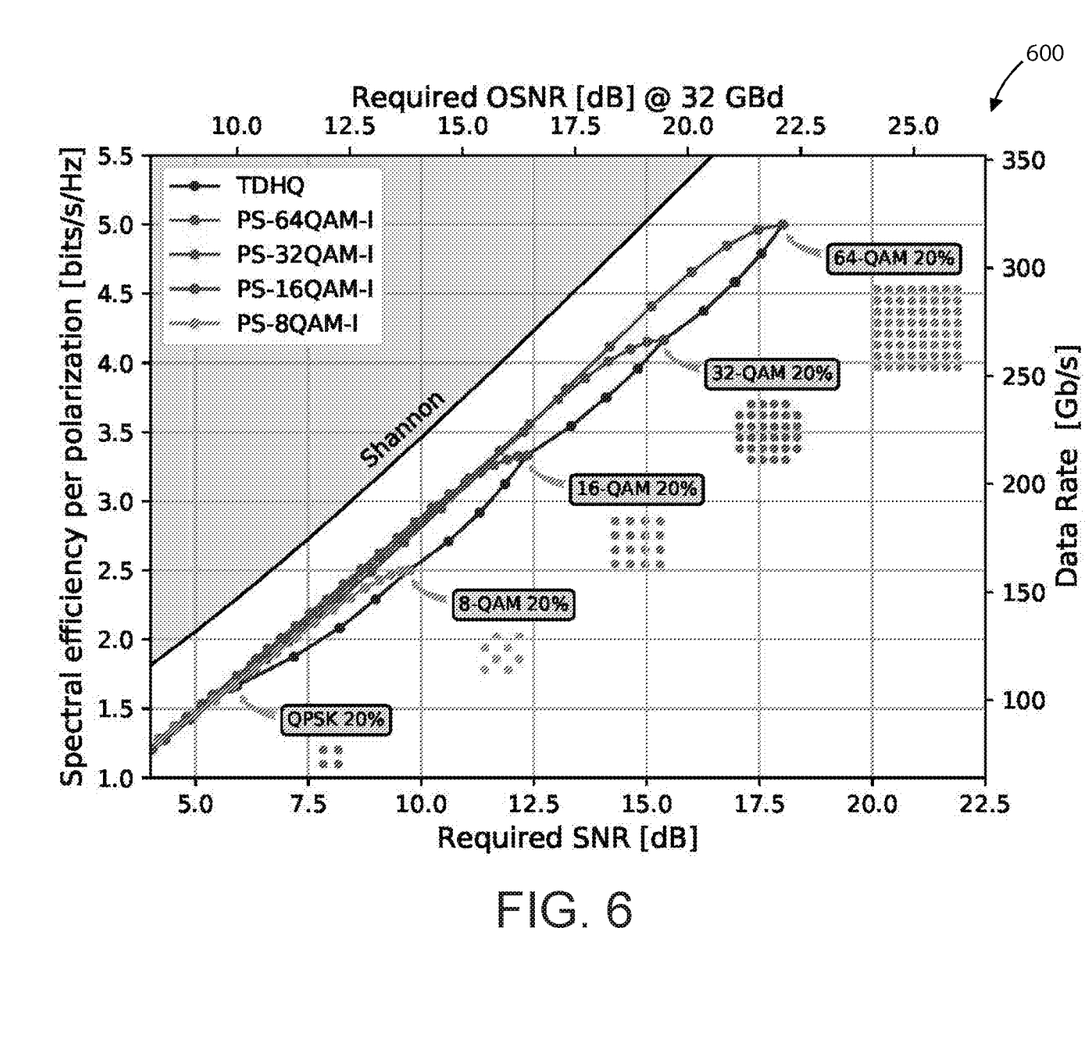
FIG. 6 is a sample graph illustrating the spectral efficiency (SE) of probabilistic shaping using the distribution matcher implementation architectures according to examples of the present invention.

FIG. 6 is a sample graph illustrating the spectral efficiency (SE) of probabilistic shaping using the distribution matcher implementation architectures according to examples of the present invention. As shown, graph 600 shows simulation results of data rate over required SNR for TDHQ, 64-QAM, 32-QAM, 16-QAM, 8-QAM, and QPSK.

Figure 7A:
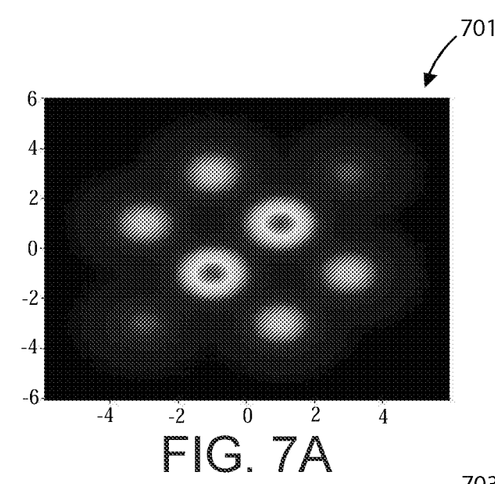
FIGS. 7A-7D are sample images of probabilistic shaped constellations using the distribution matcher implementation architectures according to examples of the present invention.
Figure 7B:
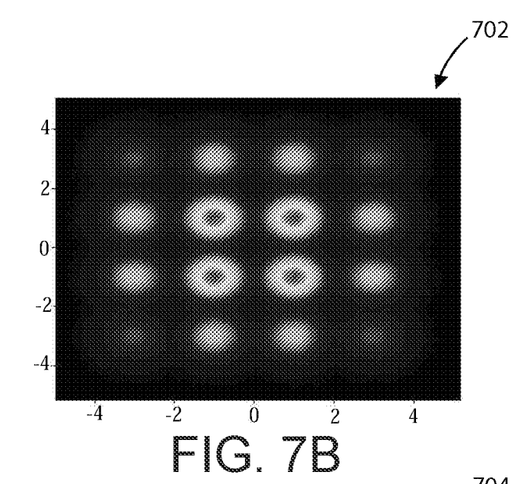
Figure 7C:
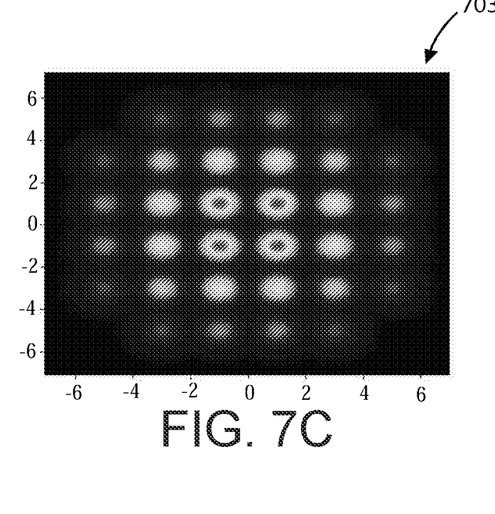
Figure 7D:
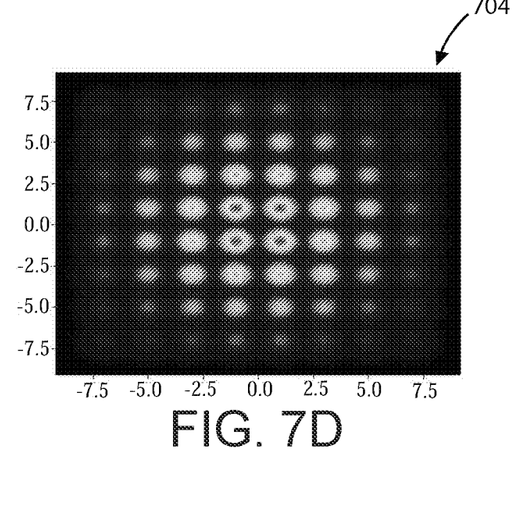

FIGS. 7A-7D are sample images of probabilistic shaped constellations using the distribution matcher implementation architectures according to examples of the present invention. FIG. 7A shows image 701 representing a signal constellation of an 8-QAM (quadrature amplitude modulation) form with SE=2.78 bits/symbol. FIG. 7B shows image 702 representing a signal constellation of a 16-QAM from with SE=3.78 bits/symbol. FIG. 7C shows image 703 representing a signal constellation of a 32-QAM form with SE=4.78 bits/symbol. And FIG. 7D shows image 704 representing a signal constellation of a 64-QAM form with SE=5.67 bits/symbol.

While the above is a full description of the specific embodiments, various modifications, alternative constructions and equivalents may be used. Therefore, the above description and illustrations should not be taken as limiting the scope of the present invention which is defined by the appended claims.

What is claimed is:

1. A transceiver comprising:
a splitter configured to receive a random sequence of bits, and split the random sequence of bits into a first sequence of bits and a second sequence of bits;
a mapper configured to convert encoded data to symbols having respective signs and amplitudes, set the signs of the symbols based on the first sequence of bits, set the amplitudes of the symbols based on the encoded data, and transmit the symbols from the transceiver; and
a distribution matching encoder configured to encode the second sequence of bits to generate the encoded data comprising codewords, the encoding of the second sequence of bits comprising controlling a number of '1' bits in each of the codewords such that the codewords have a same average transmission energy after the encoded data is converted to the symbols by the mapper, an amount of transmission energy to transmit each respective one of the codewords being based on the number of '1' bits in the respective one of the codewords.

2. The transceiver of claim 1, wherein the distribution matching encoder is configured to encode the second sequence of bits to generate the encoded data including a restricted number of '1' bits and a restricted number of '0' bits per codeword, and the restricted number of '1' bits and the restricted number of '0' bits having controlled and unequal probabilities of occurring in the encoded data.

3. The transceiver of claim 1, wherein the distribution matching encoder is configured to encode the second sequence of bits to generate the encoded data comprising non-random bits.

4. The transceiver of claim 1, wherein the distribution matching encoder is configured to encode the second sequence of bits by performing constellation shaping to provide the encoded data having a non-uniformly distributed constellation, constellation shaping referring to changing at least a number of '0' bits and a number of '1' bits to be transmitted to change a physical diagram representing quantities of possible symbols used to transmit the encoded data.

5. The transceiver of claim 1, wherein the distribution matching encoder is configured to transform the second sequence of bits, which have a uniformly distributed constellation, to the encoded data having a non-uniformly distributed constellation, each of the uniformly distributed constellation and the non-uniformly distributed constellation referring to a physical diagram representing quantities of possible symbols used to transmit the encoded data.

6. The transceiver of claim 1, wherein the distribution matching encoder is configured to encode the second sequence of bits to provide the encoded data having a greater quantity of total bits than in the second sequence of bits.

7. The transceiver of claim 1, wherein the distribution matching encoder is configured to generate the encoded data including the codewords such that each of the codewords includes a same number of '1' bits and a same number of '0' bits.

8. The transceiver of claim 1, wherein the mapper is configured to generate the symbols having a two-dimensional signal constellation with a quadrature amplitude modulation form.

9. The transceiver of claim 1, wherein the distribution matching encoder is configured to generate the encoded data using addition and comparison operations and without using multiplication and division operations.

10. The transceiver of claim 1, further comprising a forward error correction encoder configured to add parity bits to the first sequence of bits prior to the first sequence of bits being received at the mapper.

11. The transceiver of claim 1, wherein the distribution matching encoder is configured to generate the encoded data such that bits of the encoded data have controlled probabilities of occurring, where '1' bits of the encoded data have less probability of occurring than '0' bits of the encoded data.

12. The transceiver of claim 1, wherein the distribution matching encoder is configured to implement an iterative algorithm to output the encoded data including performing a plurality of comparisons to bit values of the second sequence of bits, the plurality of comparisons are performed based on a code length of the second sequence of bits and a number of bits per codeword of the encoded data.

13. The transceiver of claim 1, wherein the distribution matching encoder is configured to implement an iterative algorithm to output the encoded data including performing a plurality of comparisons between bit values of the second sequence of bits and look-up-table values.

14. A transceiver comprising:
a demapper configured to receive symbols transmitted to the transceiver, the symbols comprising codewords, the codewords having a same average transmission energy, and the demapper configured to determine signs and amplitudes of the symbols, generate random data based on the signs, and generate controlled data based on the amplitudes, bits of the controlled data having controlled probabilities of occurring in the controlled data;

a distribution matching decoder configured to generate a sequence of bits based on the controlled data, bits of the sequence of bits having an equal probability of occurring in the sequence of bits; and a merging device configured to merge the random data and the sequence of bits to provide resulting data.

15. The transceiver of claim 14, wherein the demapper is configured to generate the random data to include bits having an equal probability of occurring in the random data.

16. The transceiver of claim 14, wherein the demapper is configured to generate the bits of the controlled data to not have equal probabilities of occurring in the controlled data.

17. The transceiver of claim 14, wherein the demapper is configured to generate the controlled data to have a restricted number of '1' bits and a restricted number of '0' bits per codeword received.

18. The transceiver of claim 14, wherein the distribution matching decoder is configured to generate the sequence of bits to include fewer total bits than in the controlled data.

19. The transceiver of claim 14, wherein the demapper is configured to generate the controlled data including the codewords such that each of the codewords includes a same number of '1' bits and a same number of '0' bits.

20. The transceiver of claim 14, wherein the demapper is configured to receive the symbols having a two-dimensional signal constellation with a quadrature amplitude modulation form.

21. The transceiver of claim 14, wherein the distribution matching decoder is configured to generate the sequence of bits using addition and comparison operations and without using multiplication and division operations.

22. The transceiver of claim 14, further comprising a forward error correction decoder configured to remove parity bits from the random data prior to the random data being received at the merging device.

23. The transceiver of claim 14, wherein the distribution matching decoder is configured to transform the controlled data having a non-uniformly distributed constellation to the sequence of bits having a uniformly distributed constellation.

24. The transceiver of claim 14, wherein the demapper is configured to generate the controlled data such that bits of the controlled data have controlled probabilities of occurring, where '1' bits of the controlled data have less probability of occurring in the controlled data than '0' bits of the controlled data.

25. The transceiver of claim 14, wherein the distribution matching decoder is configured to implement an iterative algorithm to output the sequence of bits including performing a plurality of comparisons to bit values of the controlled data, where the plurality of comparisons are performed based on a code length of the sequence of bits and a number of bits per codeword of the controlled data.

26. The transceiver of claim 14, wherein the distribution matching decoder is configured to implement an iterative algorithm to output the sequence of bits including performing a plurality of comparisons between bit values of the controlled data and look-up-table values.

\* \* \* \* \*